(12) United States Patent
Kuczynski et al.

(10) Patent No.: US 9,873,774 B1
(45) Date of Patent: Jan. 23, 2018

(54) SHAPE MEMORY THERMAL INTERFACE MATERIALS

(71) Applicant: International Business Machines Corporation, Armonk, NY (US)

(72) Inventors: Joseph Kuczynski, North Port, FL (US); Kevin M. O'Connell, Rochester, MN (US); Chelsie M. Peterson, Dexter, MN (US); Mark D. Plucinski, Toms River, NJ (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/254,055

(22) Filed: Sep. 1, 2016

(51) Int. Cl.
  *C08K 3/08* (2006.01)
  *C08K 3/22* (2006.01)
  *H01L 23/373* (2006.01)
  *C09K 5/14* (2006.01)
  *C08K 7/06* (2006.01)

(52) U.S. Cl.
  CPC .......... *C08K 3/22* (2013.01); *C08K 7/06* (2013.01); *C09K 5/14* (2013.01); *H01L 23/3733* (2013.01); *C08K 2201/001* (2013.01)

(58) Field of Classification Search
  CPC ...... C08K 3/22; C08K 7/06; C08K 2201/001; C09K 5/14; H01L 23/3733
  USPC ........................................................ 524/439
  See application file for complete search history.

(56) References Cited

U.S. PATENT DOCUMENTS

| | | | |
|---|---|---|---|
| 6,294,408 B1 | 9/2001 | Edwards et al. | |
| 6,605,238 B2 * | 8/2003 | Nguyen | B23K 35/025 |
| | | | 252/500 |
| 7,159,398 B1 | 1/2007 | Bushnell et al. | |
| 2005/0027055 A1 * | 2/2005 | Dani | C09K 5/063 |
| | | | 524/439 |
| 2005/0245659 A1 | 11/2005 | Chen | |
| 2008/0149211 A1 * | 6/2008 | Yamada | C08L 79/08 |
| | | | 138/145 |
| 2010/0129648 A1 | 5/2010 | Xu et al. | |
| 2011/0038124 A1 | 2/2011 | Burnham et al. | |
| 2014/0366558 A1 | 12/2014 | Gray et al. | |
| 2017/0038159 A1 * | 2/2017 | Wood | F28F 5/00 |

OTHER PUBLICATIONS

Michal et al., Macromolecules, 48, 3239-3246, 2015.*
Li et al., "Controlled Shape Memory Behavior of a Smectic Main-Chain Liquid Crystalline Elastomer," Macromolecules, 2015, 48, pp. 2864-2874, ACS Publications. DOI: 10.1021/acs.macromol.5b00519.
Kanoglu, M., "Chapter 3: Steady Heat Conduction," Lecture presentation, retrieved Sep. 16, 2015, 51 pages.
"Heat transfer—lecture 2," Warsaw University of Technology lecture, retrieved Sep. 16, 2015, 11 pages.
"2.3 Thermal resistance and the electrical analogy," College of Energy and Power Engineering presentation, retrieved Sep. 16, 2015, 4 pages (23 slides). gc.nuaa.edu.cn/heat/other/courseware/iii/lecture%2003c.pdf.
Gnecco et al., "Friction Theory and Nanotribology," Book, Apr. 2015, p. 113-114, © Cambridge University Press 2015, https://books.google.com/books?id=BwFuCAAAQBAJ&pg=PA114&lpg=PA114&dq=thermal+and+electrical+contactresistanceanalogy&source=bl&ots=jclpB7nZ81&sig=Bchd2bFtxW_ISsMKny7jGmkPinY&hl=en&sa=X&sqi=2&ved=0CFUQ6AEwCGoVChMly5WzIeT5xwIVzBo-Ch3Azgfw#v=onepage&q=thermal%20and%20electrical%20contact%20resistance%20analogy&f=false.
Unknown, "Electrical Contact Resistance," Figure 1.10, 1 pg., retrieved Aug. 31, 2016.
Kuczynski et al., "Shape Memory Thermal Interface Materials," U.S. Appl. No. 15/254,039, filed Sep. 1, 2016.
List of IBM Patents or Patent Applications Treated as Related, Aug. 31, 2016, 2 pgs.

* cited by examiner

*Primary Examiner* — Hui Chin
(74) *Attorney, Agent, or Firm* — Jared L. Montanaro (57) ABSTRACT

Disclosed is a shape memory polymer (SMP) thermal interface material. The shape memory polymer may include a SMP matrix. The SMP matrix may include a liquid crystal elastomer. The SMP material may also include a thermally conductive filler embedded within the SMP matrix. The thermally conductive filler may include one or more substantially aligned subcomponents.

10 Claims, 6 Drawing Sheets

SHAPE MEMORY THERMAL INTERFACE MATERIALS

BACKGROUND

Aspects of the present disclosure relate to thermal interface materials; more particular aspects relate to shape memory thermal interface material pads.

Thermal interface materials create a connection between a heat producing computing component and a heat dissipating structure to decrease the temperature of the heat producing computing component. The thermal interface material may dissipate heat from the heat producing computing component by transferring the heat to a heat dissipating structure like a heat sink. The heat sink may be attached to the computing component or a structure comprising the computing component.

SUMMARY

Embodiments of the present disclosure include a shape memory polymer (SMP) thermal interface material (TIM). The SMP material may include a SMP matrix. The SMP matrix may include a liquid crystal elastomer. The SMP material may also include a thermally conductive filler embedded within the SMP matrix. The thermally conductive filler may include one or more substantially aligned subcomponents.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While embodiments of the present disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the invention.

DETAILED DESCRIPTION

Aspects of the present disclosure relate generally to shape memory polymers, and in particular, to using shape memory polymers to create thermal interface material pads. While the present disclosure is not necessarily limited to such applications, various aspects of the disclosure may be appreciated through a discussion of various examples using this context.

During operation, a computer chip, also sometimes referred to as a computing chip, may generate heat. If the heat is not dissipated, the computer chip may reach a temperature where it automatically shuts down, where it throttles back (e.g., a CPU may run at a lower clock rate), or the chip may become damaged. For example, a computing chip may have an automatic shutdown enabled when the computing chip reaches a temperature threshold (e.g., 80° C.). Upon reaching the temperature threshold of 80° C., the computing chip may shutdown or restart to prevent damage to the computing chip. To prevent the buildup of heat, a heat dissipating structure may be thermally coupled to the computing chip.

The computing chip may be a semiconducting wafer containing circuitry, which runs computerized devices. Some examples of computing chips may include, but are not limited to, Central Processing Unit (CPU) chips, Graphical Processing Unit (GPU) chips, Application Specific Integrated Circuits (ASICs), Dual In-Line Memory Modules (DIMMs), and Field Programmable Gate Array (FPGA) chips, as well as custom designed computer chips.

A heat transfer material, such as a thermal interface material (TIM), may be positioned between the computing chip and the heat dissipating structure to transfer the heat from the computing chip (e.g., CPU chip) to the heat dissipating structure (e.g., heat sink). To increase the efficiency of a TIM, one or more factors may be considered. The factors of the TIM may include: bond line thickness, bond line efficiency (e.g., how well the TIM connects the computer chip to the heat dissipating structure with lack of air bubbles, consistent thickness, etc.), consistency, and composition. The TIM composition may be improved by altering the chemicals (e.g., the purity of the chemicals) within the TIM. The consistency of the TIM may be affected if air pockets are present within the TIM. The bond line efficiency may be altered in response to the TIM incorrectly layering on the top surface of the computing chip (e.g., the TIM is not consistently spread over the top surface of the computing chip and there are ridges, gaps, etc. in the layering). The heat transfer rate from the computer chip to the heat dissipating structure may be improved by decreasing the thickness of the bond line.

Some computing chips may have a relatively large variance (e.g., greater than 200 micrometers (μm) (or 0.008 inches, 8 mil)) on their surface, which may limit the ability of heat dissipating structures to remove heat from the computing chips (e.g., due to air gaps and high thermal contact resistance). Variances such as these in the chip may be overcome by using highly compressible TIM pads at high pressures (e.g., 50 pounds per square inch (psi)) to fill in any inconsistencies on the surface of the chip by compressing the TIM pad. Issues may arise when using compressible TIM pads with computing chips, as some computing chip manufacturing companies recommend that a force no greater than 30-35 psi should be exerted upon the computing chip. If the TIM pad requires a compression force of 50 psi but the computing chip can only withstand forces of 35 psi, then the computing chip may be damaged during the compression of the TIM pad. Therefore, a highly compressible TIM at the recommended 35 psi or below is desired so that the maximum gap (e.g., distance) between the computing chip and the heat dissipating structure can be filled (including, e.g., both a thin bond line and any inconsistencies on the surfaces of the computing chip—heat dissipating structure bond).

Embodiments of the present disclosure include using shape memory polymers (SMP) as thermal interface materials (TIM) between heat producing computing components (e.g., computer chips, etc.) and heat dissipating structures (e.g., heat sinks, heat exchangers, etc.). The SMP TIMs may be formed into pads that may be positioned between the computer chips and heat dissipating structures to fill in gaps between the computer chips and heat dissipating structures, thereby improving the transfer of heat away from the computer chips. In some embodiments, the SMP TIM pad may be flexible and/or compressible. This may allow the SMP TIM to conform to the shape of the computing chip. In some embodiments, the SMP may be a liquid crystal elastomer (LCE) matrix, which may be formed and/or deformed to result in a thermal connection (e.g., able to transfer heat) between the computing chip and the heat dissipating structure.

Furthermore, aspects of the present disclosure may advantageously include a thermally conductive filler (e.g., carbon fibers), which may be embedded within the LCE matrix. An LCE matrix that includes a thermally conductive filler is referred to herein as a liquid crystal elastomer thermal interface material pad (LCE TIM pad). The LCE matrix may have shape memory properties where a first shape has a first height (e.g., thickness), length, and width. A smaller height of the LCE TIM pad may result in a thinner bond line between the computing chip and the heat dissipating structure allowing for greater thermal transfer.

It is to be understood that the aforementioned advantages are example advantages and should not be construed as limiting. Embodiments of the present disclosure can contain all, some, or none of the aforementioned advantages while remaining within the spirit and scope of the present disclosure.

Shape memory TIM pads may be constructed such that they have a desired consistency and composition, as well as an effective bond line efficiency (e.g., the TIM pad has to be layered consistently on the computing chip and is at such a thickness to promote optimal heat transfer with the heat dissipating structure) when they are created based on the size of the computing chip. The shape memory TIM may be modified between one or more states (e.g., physical states such as solids, liquids, etc.) to decrease the bond line thickness between the computing chip and the heat dissipating structure, which may increase the thermal dissipation of the heat from the computing chip (e.g., by increasing the thermal conductivity or thermal diffusivity of the TIM).

The heat dissipating structure may draw the heat from the computing chip through the TIM to the cooler heat dissipating structure. The cooling of the heat dissipating structure may include passive or active cooling. Passive cooling may occur when a structure has an increased surface area relative to the computing chip. Active cooling may occur, for example, with the use of a cooling device such as a fan or liquid cooling system configured to actively cool the heat dissipating structure, which may be a heat sink (e.g., fan cooling) or a cooling plate (e.g., liquid cooling).

The SMP TIM pad may include an SMP matrix with thermally conductive fillers (e.g., conductive fibers) suspended within the SMP matrix forming shape memory TIM pads. SMPs may be "smart materials" which may return to an "original" (e.g., first, un-deformed, etc.) state or shape after being transformed to a "deformed" (e.g., second, transformed, etc.) state or shape. The deformed state may be produced when the shape memory TIM pad is exposed to an external stimuli (e.g., a condition change). For example, external stimuli may include changes in temperature, light, magnetic fields, and physical stimuli, such as changes in pressure and external forces. The SMP may include a LCE as the smart memory matrix allowing for a reversible liquid crystalline (LC) phase transition. The LC phase transition may allow a SMP to transform between two different phases (e.g., states) based on external stimuli. Accordingly, the SMP TIM that includes an LCE matrix may be reversibly changed between a first (e.g., original) state and a second (e.g., deformed) state using the external stimuli.

The SMP matrix may include, but is not limited to, polymers that may be reversibly altered between a first state (e.g., first shape) and a second state (e.g., second shape) in response to external stimuli. SMP matrices may include, for example, LCEs, thermoresponsive polymers such as polyurethane, polyesters (e.g., polyethylene terephthalate), polyethers (e.g., polyethylene glycol), or various co-polymers (e.g., copolyesters). In some embodiments, the SMP matrix may be physically cross-linked linear block copolymers (e.g., polyurethanes) with ionic or mesogenic components. In various embodiments, various shape memory polymers may be utilized as matrices along with the thermally conductive fillers to create shape memory TIM pads.

In various embodiments, the deformation of the SMP TIM pad may include using a first frequency or wavelength of light. The wavelength may be determined based on the composition of the SMP being used as the SMP matrix. For example, a LCE may be shaped and maintained at the deformed shape by exposing the LCE to 280 nm ultraviolet light. The ultraviolet light (100-400 nm) may cure the SMP TIM pad at the deformed shape.

In some embodiments, the shape memory polymer thermal interface material may include a shape memory polymer matrix. The shape memory polymer matrix may include a liquid crystal elastomer. Additionally, a thermally conductive filler may also be embedded within the shape memory polymer matrix. The thermally conductive filler may include substantially aligned subcomponents. In some embodiments, the subcomponents may include electromagnetically responsive particles, fibers, or any combination of particles and fibers substantially aligned in a first direction. In some embodiments, the electromagnetically responsive particles, fibers, and/or combination of particles and fibers may be configured to deform to a second direction.

For example, the particles and/or fibers in the thermally conductive filler may be oriented in the SMP TIM pad such that the particles and fibers are substantially pointed left-to-right (e.g., aligned in a first direction). The particles and/or fibers may then have a pressure (or heat) applied to them and deform to an up-and-down position (e.g., a second direction). In some embodiments, the thermally conductive filler in the SMP TIM pad may be configured to deform its particles and/or fibers in such a way as to relieve stress and pressure from the computing chip.

In some embodiments, the shape memory polymer matrix may be configured to expand anisotropically. In other embodiments, the shape memory polymer matrix may be configured to expand isotropically. In some embodiments, the shape memory polymer matrix includes one or more cross-linking polymer networks.

In some embodiments, a shape memory polymer matrix and a thermally conductive filler may be mixed to create a shape memory polymer mixture. The shape memory polymer mixture may be extruded through a die. The thermally conductive filler in the shape memory polymer mixture may be aligned in substantially the same direction. The shape memory polymer mixture may be cured at a first temperature (e.g., a curing temperature). The curing may cause the shape memory polymer mixture to harden. As used herein, hardening includes increasing the viscosity of the shape memory polymer mixture such that the hardened shape memory polymer mixture is capable of being cut into individual pads that substantially retain their shape when not subjected to external pressures or elevated temperatures. The shape memory polymer mixture may then be sliced into one or more shape memory polymer thermal interface material pads.

In some embodiments, the shape memory polymer mixture may be heated to a second temperature and may be held at the second temperature while passing through the die during extrusion. In some embodiments, the second temperature may be above the first temperature (e.g., above the curing temperature and may cause the shape memory polymer mixture to become pliable and malleable, such as in a highly viscous liquid state).

In some embodiments, the thermally conductive filler may be ferromagnetic. In some embodiments, in order to substantially align the thermally conductive filler in the same direction, a direction of thermal conduction (e.g., a direction that the user wants the heat to transfer) may be determined (e.g., it must be determined on which side the heat sink will be bonded to the SMP TIM pad, in order for the filler to direct the heat generated by the computing chip away from the chip and towards a heat dissipating structure). In some embodiments, after determining a direction of thermal conduction, a magnetic field may be applied to the thermally conductive filler. The magnetic field may orient the filler in the direction of thermal conduction.

For example, a thermally conductive filler may contain iron fibers and it may be determined that a heat sink will be applied to an area directly atop the SMP TIM pad (e.g., which includes the thermally conductive filler). A magnetic field may be applied to the thermally conductive filler. The magnetic field may have a strong magnetic pull nearest the top of the thermally conductive filler, inducing the iron fibers to align in substantially the same direction (e.g., pointing upwards).

In some embodiments, the thermally conductive filler may be substantially aligned in the same direction during extrusion. For example, a thermally conductive filler may include two or more particles or fibers that are initially aligned in a non-uniform way (e.g., each fiber is aligned in a different orientation). The thermally conductive filler (while mixed in the shape memory polymer mixture) may be extruded through a die and the fibers in the thermally conductive filler may be physically (e.g., forcibly) aligned in a substantially uniform direction. For example, the die may include a sieve or sieve-like structure. As the mixture is extruded through the die, the thermally conductive filler (e.g., the particles or fibers) may interact with the sieve such that the filler is physically aligned in substantially the same direction.

In some embodiments, to cure the shape memory polymer mixture, the shape memory polymer mixture may be heated to a first temperature. In some embodiments, the shape memory polymer mixture may be held at the first temperature for a predetermined time. The predetermined time may be determined by the physical properties of the shape memory polymer mixture. In some embodiments, the shape memory polymer mixture may be cooled in order to harden and finish curing.

For example, a shape memory polymer mixture may be a mixture of polyurethane and silver fibers. It may be determined that the mixture of polyurethane and silver fibers substantially harden with heated to a temperature of 100° C. and held at that temperature for 20 minutes. The mixture may be held at 100° C. for 20 minutes and let cooled for an hour. Upon cooling, the mixture may be substantially hardened compared to the mixture being uncured. The mixture may then be sliced into SMP TIM pads.

Figure 1:
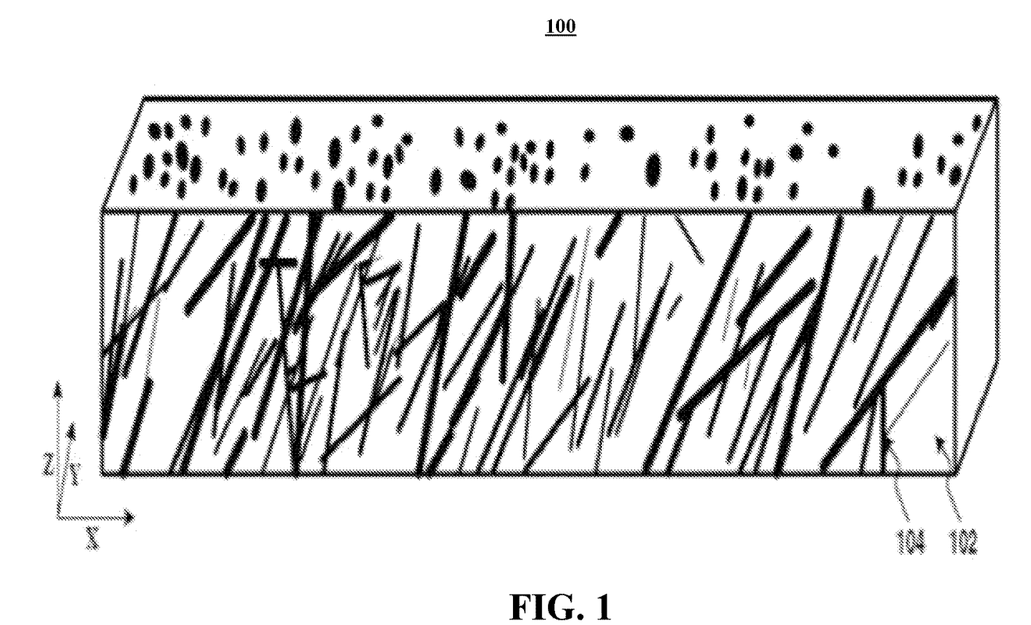
FIG. 1 depicts an example liquid crystal elastomer thermal interface material pad with a thermally conductive filler, according to various embodiments of the disclosure.

FIG. 1 depicts an example SMP TIM pad 100, according to embodiments. The SMP TIM pad 100 may include a SMP matrix 102 (e.g., an LCE) and a thermally conductive filler 104 (e.g., carbon fibers). The thermally conductive filler 104 may be suspended within the SMP matrix 102 during a mixing operation. The mixture of the thermally conductive filler and the SMP matrix may then be extruded through a die and cured to solidify the SMP matrix. Before extruding, the thermally conductive filler 104 may be arranged so the thermally conducive filler (e.g., the conductive particles, fibers, or particles and fibers of the thermally conductive filler) are aligned substantially in a first direction.

In various embodiments, the thermally conductive filler may include particles, which may be dispersed substantially uniformly within the SMP matrix. The SMP TIM may be extruded through a die to create a SMP TIM block, which may be sliced into one or more SMP TIM pads. The extruded and sliced SMP TIM pad may have a first shape with a first length (illustrated as the X-axis), a first width (illustrated as the Y-axis, extending into the page), and an overall height (illustrated as the-Z axis). The block of SMP TIM pads may be sliced (e.g., along the XY-plane—to a first height to create a SMP TIM pad 100 at a first height or at a first state (e.g., non-deformed state).

In various embodiments, the thermally conductive filler may be (or include) thermally conductive particles. The thermally conductive particles may include non-fibrous chemical particles or molecules that have heat-transferring properties. Thermally conductive particles may include chemical particles such as beryllium oxide, aluminum nitride, aluminum oxide, silver, boron nitride, or zinc oxide. These thermally conductive particles may be used alone as thermally conductive fillers, or in combination with a thermally conductive filler of a fibrous nature.

For example, carbon fibers and beryllium oxide may be added to the SMP matrix and utilized as a thermally conductive filler. Any combination of one or more thermally conductive particles and/or one or more thermally conductive fibers may be used as the thermally conductive filler. In some embodiments, the thermally conductive filler may include electromagnetically responsive particles that may be substantially aligned in a first direction at a curing temperature. The electromagnetically responsive particles may be substantially aligned by holding a magnet over the SMP TIM pad while the SMP TIM pad, which includes the thermally conductive filler, is at the curing temperature (e.g. the temperature at which the SMP TIM is hardening).

For example, an SMP TIM may be produced by combining a thermally conductive filler that includes metallic particles and an LCE. The SMP TIM material (e.g., the thermally conductive filler and the LCE) may be malleable and extruded and sliced into a wafer. To harden the SMP TIM material, the wafer may be heated or cooled to a curing temperature, while curing the wafer, a magnet may be held directly over the wafer. The magnet may perpendicularly align all the metallic particles found in the wafer. In some embodiments, the magnet may make contact with the wafer. In some embodiments, the particles may not be perpendicularly aligned, they may be substantially aligned in any direction.

The SMP matrix 102 may consist of cross-linked polymer networks, which may form a first size or state (e.g., an un-deformed state or an original state) of the SMP TIM pad. The first state of the SMP TIM pad may be altered to a deformed state, and then reformed back to the first state (e.g., see FIG. 2). Each polymer molecule (or polymer chain) of a cross-linked polymer network may be bonded with covalent or ionic bonds to another polymer chain or molecule within the matrix. These cross-linked polymer networks may define the first shape of the SMP TIM pad and allow for a reformation of the SMP TIM pad to the first state after a deformation.

The SMP matrix may be deformed by a condition change (e.g., external stimuli) such as temperature. In some embodiments, the SMP matrix may have a reformation temperature (e.g., first temperature), causing the SMP TIM pad to reform to a non-deformed state (e.g., first state, or compressed state, or original state) from a deformed state (e.g., second state, expanded state, or altered state). For example, the reformation temperature may be 100° C., and when an SMP TIM pad in a second state is exposed to the reformation temperature, the SMP TIM pad may compress to the first state.

In another example, an SMP TIM may be bonded between a computer chip and a heat dissipating structure. The computer chip may be a part of and used by a high-performance computer. While being used by the high-performance computer, the computer chip may increase in heat (e.g., from room temperature 21° C. to 50° C.). The heat generated by the computer chip may transfer into the bonded SMP TIM and the SMP TIM may have a transition state temperature of 48° C. The SMP TIM may transition from a solid to a high viscosity liquid (e.g., from a compressed first state to an uncompressed second state), the liquid state of the SMP TIM may allow for greater heat transfer between the computer chip and the heat dissipating structure (e.g., by increasing surface area, thermal conductivity, thermal conductivity, etc.). In some embodiments, after the SMP TIM has sufficiently cooled the computer chip by being a thermal medium to transfer heat to the heat dissipating structure and the temperature has dropped below the SMP TIM's transition state temperature. The SMP TIM may return to the compressed first state (e.g., solid state). In some embodiments, in addition to the heat transfer properties of the SMP TIM pad, the SMP TIM pad may contract in the compressed first state to avoid excessive normal force being applied to the computer chip.

In some embodiments, the SMP matrix may have a deformation temperature (e.g., second temperature, transition state temperature, etc.) and when the SMP matrix is heated to the deformation temperature, the SMP matrix may expand. The SMP TIM pad may deform to a deformed state (e.g., second state) when it is heated to the deformation temperature. For example, the deformation temperature may be 125° C., and when an SMP TIM pad in the first state is exposed to the deformation temperature, the SMP TIM pad may deform (e.g., expand) to the second state.

The SMP TIM pad 100 may also be viewed as a cross section of a SMP TIM block that expands on the Z-axis. The SMP TIM block may include thermally conductive fillers that extend along the Z-axis for the conduction of heat from a computing chip to a heat dissipating structure. When the SMP TIM block is sliced along the XY-plane, the thermally conductive filler may be aligned (e.g., oriented) such that the heat may flow in the direction of the orientation of the thermally conductive filler from the bottom to the top in the Z-axis direction. In various embodiments, the thermally conductive filler may be partially askew from perpendicular to the XY-plane (via the combined X-axis and Y-axis) but still allow heat to flow through the thermally conductive filler to the heat dissipating structure.

The thermally conductive filler 104 may perform the heat dispersion functionalities of the SMP TIM pad 100. For example, the thermally conductive filler 104 may be selected from the group consisting of carbon fibers, carbon nanotubes, silicon carbide, beryllium oxide, aluminum nitride, aluminum oxide, silver, boron nitride, zinc oxide, etc. The thermally conductive filler 104 may be suspended within the SMP matrix 102 and aligned such that thermally conductive filler is substantially in a first orientation (e.g., a majority of the thermally conductive fibers may be within ±30° of perpendicular to the XY-plane). For example, the first orientation of the SMP TIM pad 100 may be along the Z-axis.

In various embodiments, the heat dispersion functionalities of the thermally conductive fibers may be increased or decreased according to the bond line, the concentration of thermally conductive filler compared to the SMP matrix, and/or the alignment of the thermally conductive filler. A decrease in the bond line (e.g., the bond thickness between the computing device and the heat dissipating structure) may increase the heat dispersion functionality of the SMP TIM pad due to the decreased distance the heat will have to travel before reaching the heat dissipating structure. Also, an increase in the concentration (or amount) of thermally conductive filler may increase the heat dispersion functionality of the SMP TIM pad due to the increase in thermal transferring material of the SMP TIM pad. The alignment of the thermally conductive filler may allow for an increased heat dispersion functionality of the SMP TIM when the thermally conductive filler is at a substantially perpendicular orientation with regard to the computing chip and heat dispersal device (e.g., due to particle lattices of the thermally conductive filler in the perpendicular orientation negligibly reflecting and deflecting heat in a direction away from the heat dissipating structure).

Figure 2:
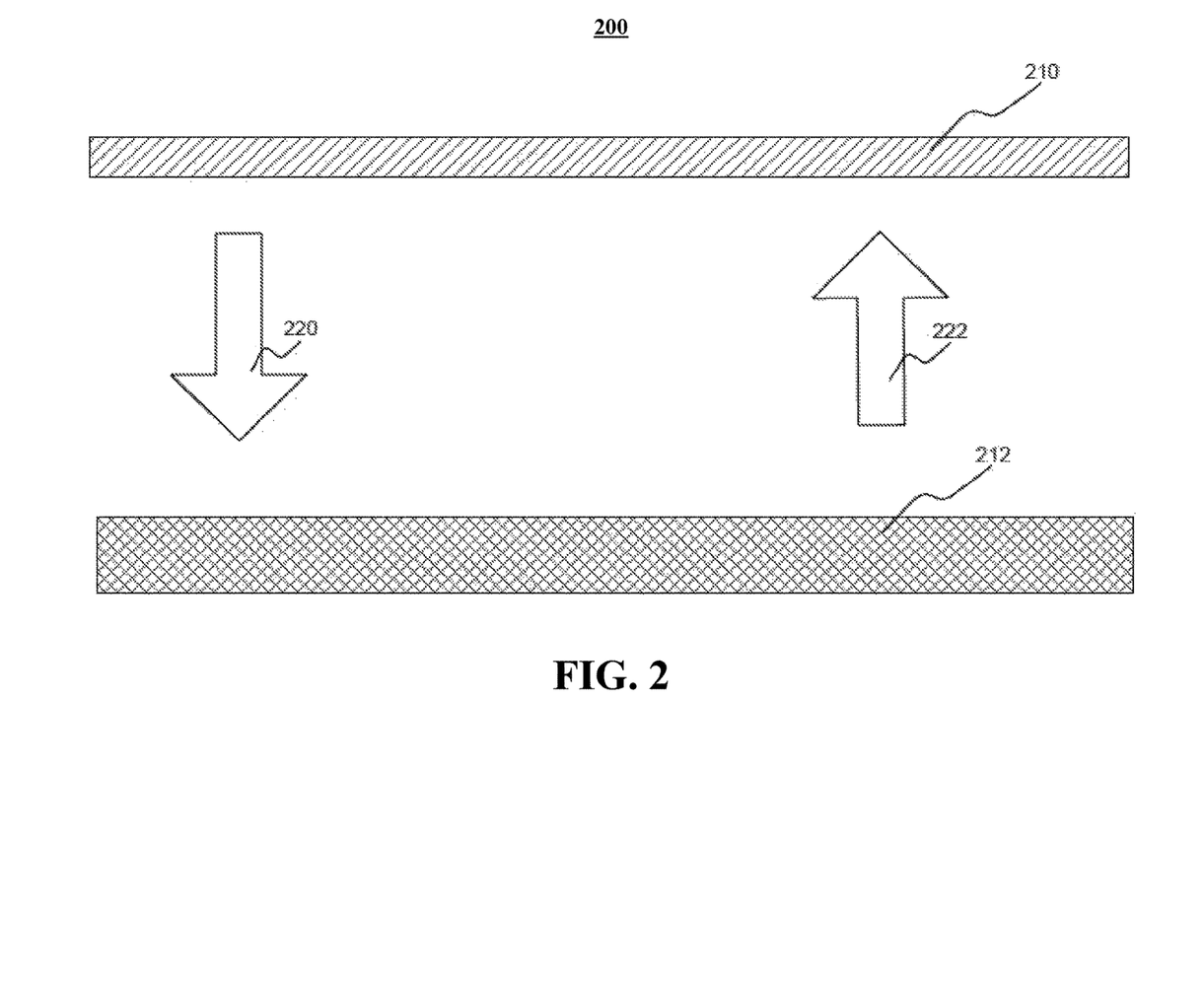
FIG. 2 depicts an example shape memory liquid crystal elastomer thermal interface material pad changing between a first state and a second state, according to various embodiments of the disclosure.

FIG. 2 depicts an example shape memory shape memory polymer thermal interface material pad changing between a first state and a second state, according to embodiments. A SMP TIM pad may be altered from an original state 210 (e.g., a first state, compressed state) SMP TIM pad to a deformed state 212 (e.g., a second state) SMP TIM pad. The SMP TIM pad may be exposed to one or more condition changes to alter the state of the SMP TIM pad. For example, the original state 210 may be exposed to a first condition change 220 (e.g., expansion condition change, such as an elevated temperature). This may cause the SMP TIM to transition from the original state 210 (e.g., first state) to the deformed state 212 (e.g., second state).

Likewise, the SMP TIM pad may be transitioned from the second state to the first state. For example, the SMP TIM pad in a deformed state 212) may be exposed to a second condition change 222 (e.g., a compression condition change, reformation condition change, such as a lower temperature). This may cause the SMP TIM to transition from the deformed state 212 (e.g., second state) to the original state 210 (e.g., first state).

In various embodiments, the expansion condition change of the SMP TIM pad may be done using a method called cold drawing. The cold drawing processes may alter the SMP TIM pad to the deformed state mechanically without altering the SMP TIM pad to a second temperature. The cold drawing process may be an expansion processes and may act as a first condition change for the SMP TIM pad. The cold drawing process may be performed by mechanical means using an expansion apparatus including a first plate and a second plate configured to exert an expansion force on the SMP TIM pad.

The expansion condition change for an expansion condition change 220 may also be an expansion force being exerted on the original state 210. The original state 210 may be deformed using mechanical means to exert a force on the SMP TIM pad. By mechanically expanding the original state 210 to a desired height, the deformed SMP TIM pad may then be heated to define a second state (e.g., deformed state 212). For example, the SMP TIM pad may be attached to two opposing plates. The first plate and second plate may include an attachment force (e.g., vacuum suction) that attaches to either side of the height (e.g., on opposite sides) of the SMP TIM pad. The plates may then pull away from each other, putting the SMP TIM pad in tension and causing the SMP TIM pad to transition to the deformed state 212. The SMP TIM pad may additionally be heated above operating temperatures of the computing chip (e.g., 120-200° C.) to transition the SMP TIM pad to the deformed state. In various embodiments, the deformation temperature may be within a range of 130-190° C. In other embodiments, the deformation temperature may be within a range of 150-170° C. Because the SMP TIM pad was strained while at a heightened temperature, the SMP TIM pad may retain its shape (e.g., stay in the deformed state), even after the mechanical strain is relaxed and the SMP TIM pad returns to room temperature. For example, the SMP TIM pad may be expanded from 1 mm to about 1.5 mm and then heated to about 120° C. to maintain the shape of the SMP TIM pad in the deformed state.

In the deformed state 212, the SMP TIM pad may be greater in size in at least one dimension (e.g., greater in height) than while in the original state 210. For example, the SMP TIM pad may have a height of 1 mm in the original state 210. The SMP TIM pad may then be exposed to an expansion condition change for heating the SMP TIM pad from room temperature to 125° C., at a rate of about 2° C. per minute, to cause the expansion condition change altering the height of the SMP TIM pad to 1.5 mm. The SMP TIM pad may then be held at the expansion trigger temperature for a period of time (e.g., one minute) then cooled to a third temperature (e.g., room temperature (21° C.)), at about 1° C. per minute to maintain the deformed state.

In an additional example, the SMP TIM pad may be in a deformed state and may have a height of 1.5 mm. The SMP TIM pad may then be exposed to a reformation condition change (e.g., a reformation condition change 222, FIG. 2) of heating the SMP TIM pad in the deformed state to a reformation temperature. For example, the reformation temperature may be within a range of 80-120° C. In the example, the reformation temperature may be 100° C. After heating the SMP TIM pad to the reformation temperature of 100° C., the SMP TIM pad may be held at 100° C. for a period of time and then cooled at about 2° C. per minute to room temperature, to cause the reformation condition change altering the height of the SMP TIM pad to 1 mm. The SMP TIM pad may be held at the reformation condition change temperature until the SMP TIM pad compresses to the 1 mm height, the SMP TIM pad may then be cooled to room temperature (or some other operating temperature) to maintain the original state of the SMP TIM pad.

In various embodiments, the changing of the SMP TIM pad from the first state to the second state may likewise change the width and length of the SMP TIM pad. This may be because the SMP TIM pad material may undergo or experience isotropic shape changes (i.e., uniform in all directions). If the SMP TIM pad changes shape isotopically, the length and width of the SMP TIM pad may also be increased when transitioning the SMP TIM pad from the first state to the second state. For example, the SMP TIM pad in the original state may be 30 mm in width, 30 mm in length, and 1 mm in height. When the SMP TIM pad transitions to the second state, it may expand in all directions by 5% in size. Accordingly, the dimensions of the SMP TIM pad in the second state SMP TIM may be 31.5 mm in width, 31.5 mm in length, and 1.05 mm in height.

In various embodiments, the SMP TIM pad may expand anisotropically or in an anisotropic direction (i.e., directionally dependent, not isotropic). The anisotropic expansion may allow the SMP TIM pad to expand only in height, only in two directions, and/or at different rates, depending on embodiments or matrices of the SMP. The anisotropic expansion of the SMP TIM pad may result in the SMP TIM pad only increasing in height while remaining the same in width and length. For example, anisotropic expansion of the SMP TIM pad may result from a SMP TIM pad in an original state of 30 mm in width, 30 mm in length, and 1 mm in height to a deformed state of 30 mm in width, 30 mm in length, and 1.5 mm in height.

FIGS. 3A-D depict an example process of attaching a heat dissipating structure to a circuit board using a shape memory polymer thermal interface material pad, according to embodiments of the present disclosure. A heat dissipating structure 350 may be attached to a circuit board 300 for a heat dispersal of a computing chip 340 that is communicatively coupled to the circuit board and thermally coupled to the heat dissipating structure via a SMP TIM pad. An SMP TIM pad in the deformed state 312 (e.g., second state) may be placed between the computing chip 340 and the heat dissipating structure 350 (e.g., on the bare die of the computing chip 340 opposite the printed circuit board 300). The deformed state 312 of the SMP TIM pad may be a result of the SMP TIM pad being deformed (e.g., the expansion condition change 220, of FIG. 2) from an original state (e.g., the original state 210, of FIG. 2). The deformed state SMP TIM pad 312 may then be subjected to a first condition change by heating the SMP TIM pad to a compression condition change temperature to compress the SMP TIM pad to the original state 310. The heat dissipating structure 350 may then be fastened to the circuit board 300 using one or more fasteners 360.

Figure 3A:
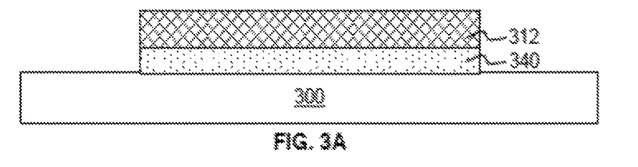
FIGS. 3A-3D depict an example process for attaching a heat dissipating structure to a circuit board using a shape memory liquid crystal elastomer thermal interface material pad, according to various embodiments of the disclosure.

In FIG. 3A, a SMP TIM pad in a deformed state 312 is positioned on a computing chip 340, wherein the computing chip is communicatively coupled to a printed circuit board 300. In some embodiments, the SMP TIM pad may be in a deformed state before being placed on the chip 340. The deformed SMP TIM pad 312 may be obtained by subjecting a SMP TIM pad in a relaxed (e.g., un-deformed) state to an expansion condition. For example, a tensile mechanical load may be used to expand the SMP TIM pad. The tensile load may be applied by attaching metal plates to opposite ends of the SMP TIM pad, and then applying an expansive force (e.g., deformation force) that causes the plates to move away from each other, putting the SMP TIM pad in tension. The tensile load may be applied while the SMP TIM pad is at a deformation temperature. The tensile load may be maintained for a predetermined period of time that causes the SMP TIM pad to retain its deformed shape. The magnitude of the tensile load, the elevated temperature, and the period of time may be based on the particular LCE material of the SMP TIM pad. The SMP TIM pad may then be allowed to cool and the mechanical load may be relaxed.

In various embodiments, the SMP TIM pad may be deformed after being placed on the chip 340. For example, the SMP TIM pad in the original state may be attached (e.g., mated) to the chip. The SMP TIM pad may then be exposed to an expansion condition change temperature (e.g., an expansion trigger temperature of 125° C., FIG. 2).

Figure 3B:
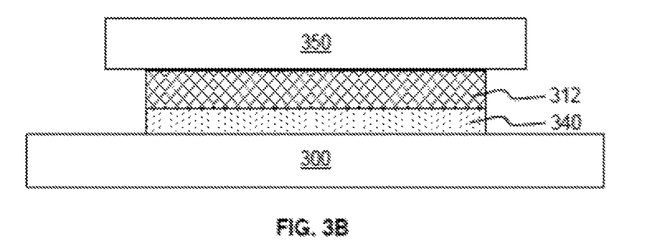

In FIG. 3B, a heat dissipating structure 350 is positioned above the computing chip 340 with the deformed state SMP TIM pad 312 positioned between the computing chip and the heat dissipating structure. The heat dissipating structure 350 may include a first surface in contact with the SMP TIM pad, and one or more other surfaces for cooling the heat dissipating structure. In various embodiments, the first surface of the heat dissipating structure 350 and/or the surface of the computing chip 340 in contact with the SMP TIM pad may be inconsistent and require a first pressure to be exerted on the SMP TIM pad to fill in the inconsistencies.

Figure 3C:
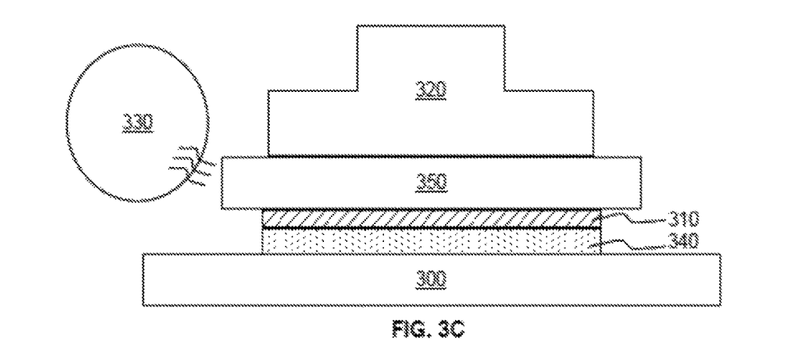

In FIG. 3C, the SMP TIM pad may be altered from the deformed state to an original state 310. A loading force (e.g., compressive load) may be applied to the heat dissipating structure 350 by a compression element 320. The loading force may be based on the materials used, the allowable load of the chip, and the thermal resistance requirements of the intended application. The condition change may be a result of compressing the heat dissipating structure 350, using a compression element 320 (e.g., a hydraulic press), into the computing chip 340 and the circuit board 300, and heating the deformed SMP TIM pad. The deformed SMP TIM pad may then return (shrink) to the original state SMP TIM pad 310. The original state SMP TIM pad 310 may create a thinner bond line between the heat dissipating structure 350 and the computing chip 340 when compared to the deformed state of the SMP TIM pad (e.g., deformed SMP TIM pad 312 of FIG. 3B). While the compression force is being applied, the SMP TIM pad may be heated by a heating element 330. The heating element 330 may reform the SMP TIM pad to the original state. For example, the heating element may heat the SMP TIM pad to 100° C. to trigger the compression condition change altering the SMP TIM pad to the original state 310. The original state 310 may create a thinner bond line between the heat dissipating structure 350 and the computing chip 340 when compared to the deformed state 312 of the SMP TIM pad (e.g., deformed SMP TIM pad 312 of FIG. 3B).

For example, a deformed SMP TIM pad at 1.5 mm may undergo a compression change to the original state of the SMP TIM pad using a hydraulic press and a forced air heating element. The hydraulic press may apply a first force to the SMP TIM pad and compress the SMP TIM pad, and the forced air heating element may heat the SMP TIM pad to 100° C. causing a compression condition change and shrinking the SMP TIM pad to the original state at 1 mm.

In various embodiments, thermal property requirements of the SMP TIM pad may be determined based on the type of computing chip and the type of heat dissipating structure. For example, if the computing chip can only withstand 30 psi of compressive force, then the thermal property requirements may require a thinner SMP TIM pad before compression and a load force of less than 30 psi to the SMP TIM pad.

The contraction of the SMP TIM pad to the original state 310 from the deformed state SMP TIM pad 312 may reduce the distance between the heat dissipating structure 350 and the computing chip 340. The reduction of the distance between the heat dissipating structure 350 and the computing chip 340 may increase the thermal dissipation from the chip to the heat dissipating structure. Increasing the thermal dissipation may reduce the operating temperature of the computing chip 340. For example, a computing chip may operate under a first computational load at 55° C. with a SMP TIM pad height of 1.5 mm, but operate at 50° C. under the first computational load with a SMP TIM pad height of 1 mm due to the increased thermal dissipation.

The compression of the SMP TIM pad 310 using the compression element 320, along with the flexibility of the SMP TIM pad, may result in the SMP TIM pad filling any inconsistencies of the computing chip 340 and/or the heat dissipating structure 350. For example, if the computing chip 340 has a 200 µm inconsistency protruding from the top surface of the chip in contact with the SMP TIM pad, the SMP TIM pad may flex to fill in the inconsistency while remaining in contact with the top surface of the chip. In another example, the computing chip may have a 100 µm void on the top surface of the chip. The SMP TIM pad may flex and fill in the 100 µm void in the top surface of the chip.

Figure 3D:
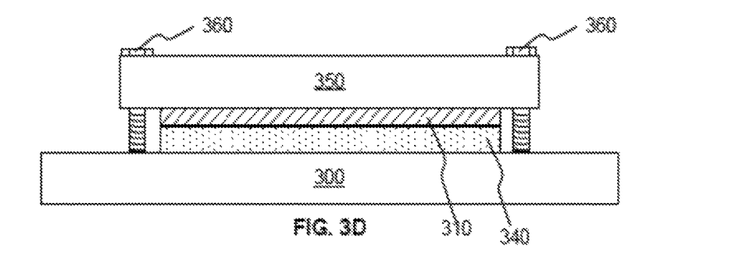

In FIG. 3D, the heat dissipating structure 350 may be fastened to the circuit board 300 using one or more fasteners 360. Examples of fasteners 360 may include CPU mounts, screws, a latch system, pressure mount clips, pins, springs, spring clips, bolts, or any other means of fastening devices. The fasteners may maintain a compressive pressure on the heat dissipating structure, forcing the original state SMP TIM pad 310 into the computing chip 340. The compressive pressure exerted by the fasteners may be used to maintain the contact between the original state SMP TIM pad 310, the computing chip 340, and the heat dissipating structure 350, fixing the bond lines.

Figure 4:
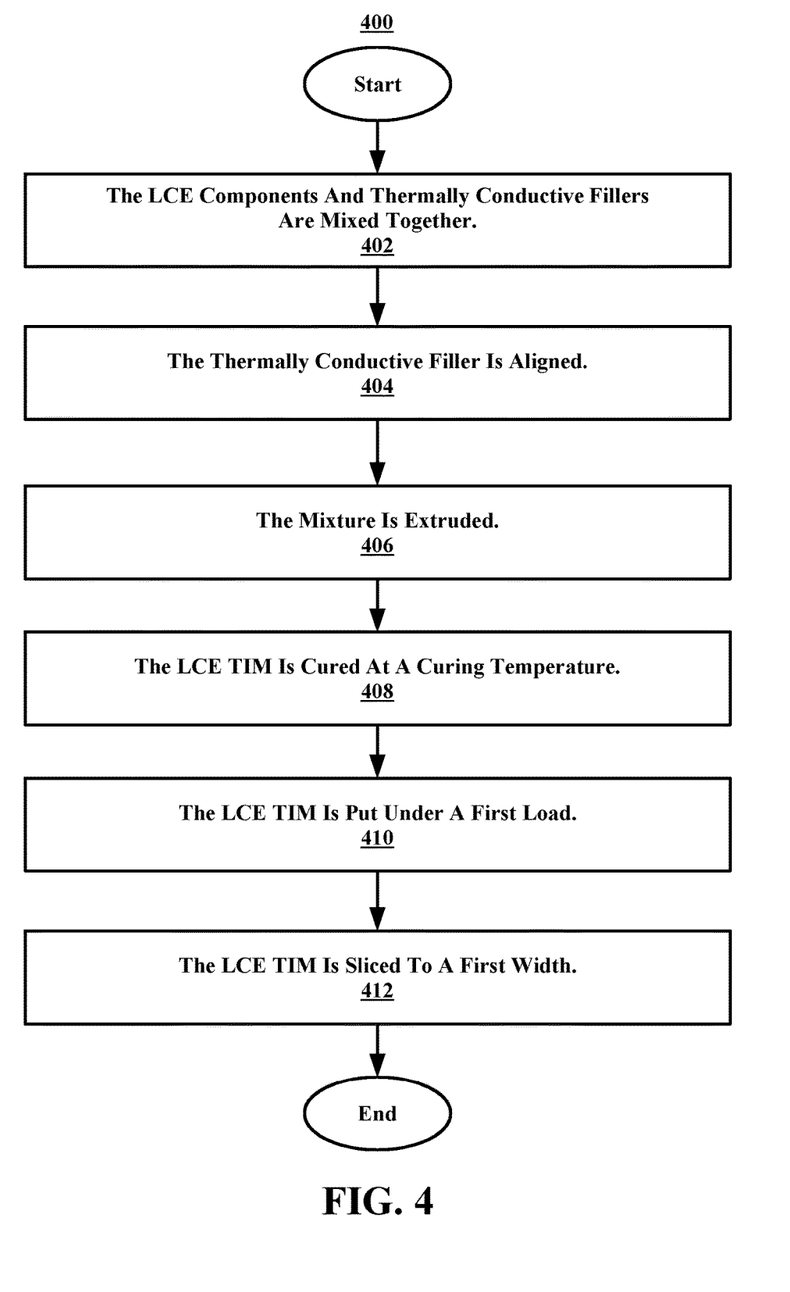
FIG. 4 depicts a flowchart of an example method for making a liquid crystal elastomer thermal interface material pad, according to various embodiments of the disclosure.

FIG. 4 depicts a flowchart of an example method 400 for making a shape memory polymer thermal interface material pad, according to embodiments of the present disclosure. The method 400 may include a process for the production of a SMP TIM pad at a first state and size. The SMP TIM pad may have a first size including a first length, width, and height.

In operation 402, SMP components and a thermally conductive filler may be mixed together to create a TIM solution or mixture including an SMP matrix and the thermally conductive filler. In some embodiments, the SMP components may include a LCE. The SMP mixture may be created by mixing a first quantity of the LCE components with a second quantity of thermally conductive fillers. The LCE components may be mixed within a container at a determined mixing temperature and oscillation speed. For example, a SMP may be an LCE and a thermally conductive filler may be carbon fibers. The LCE and carbon fibers may be measure in a 2:1 ratio and mixed in a continuous stirred-tank reactor (CSTR). The LCE and carbon fibers may be mixed in the CSTR at a temperature that puts the LCE at a viscosity that allows for relatively easy mixing (as compared to a high viscosity that may hinder the stirring component of the CSTR). In various embodiments, one or more different thermally conductive fillers may be used within the SMP TIM mixture.

In operation 404, the thermally conductive filler of the SMP TIM mixture may be aligned in a particular orientation (e.g., such that the fibers generally are aligned in the same or substantially similar direction). The thermally conductive filler or fibers (e.g., thermally conductive filler 104, FIG. 1) of the SMP TIM may be aligned such that the thermally conductive filler may direct the heat generated from the chip, through the SMP TIM pad, to the heat dissipating device. The thermally conductive filler may be oriented in a second direction relative to a first orientation of the extrusion die. In various embodiments, a magnetic field may be applied to the SMP TIM mixture to align the thermally conductive filler.

For example, a user may determine that the direction of heat transfer will be going from left to right by having the left surface of the SMP TIM pad touching a computing chip and the right surface of the SMP TIM pad touching a heat sink. The user may substantially align the thermally conductive filler in the SMP TIM mixture during extrusion in a left/right orientation so that the SMP TIM pad may attach to the computing chip and heat sink and direct heat from left to right.

In operation 406, the SMP mixture may be extruded. The SMP mixture may be extruded though a die having a first length and a first width. The die may produce a SMP TIM brick of the first length and first width. The extrusion die may be oriented in a first orientation relative to a second orientation of the thermally conductive filler. For example, the extrusion die may be oriented in a first direction substantially perpendicular to the orientation of the thermally conductive filler.

In some embodiments, operations 404 and 406 may not be distinct operations. For example, the extrusion process may also cause the thermally conductive filler to align in substantially the same direction. For example, a die used during extrusion may include sieve-like structure. As the SMP TIM mixture is extruded through the die, the thermally conductive filler (e.g., the particles or fibers) in the SMP TIM mixture may interact with the sieve such that the filler is physically (e.g., forcibly) aligned in substantially the same direction.

In operation 408, The SMP TIM brick may be cured at a first temperature for a first time. The SMP TIM brick may be cured to maintain the first length and width of the SMP TIM brick. By curing the SMP TIM brick, the SMP TIM brick may maintain its shape before and during slicing to create a SMP TIM pad of a first length, a first width, and a first height. For example, the SMP TIM brick may be cured at 170° C. at a time of six hours. In various embodiments, the SMP TIM brick may be cured at a first temperature, wherein the first temperature is the compression state temperature. The original state (e.g., first state) (e.g., original state 210, FIG. 2) temperature may cause the SMP TIM to return to the original state after being deformed to a second state (e.g., deformed state 212, FIG. 2).

In some embodiments, the curing temperature and/or time for curing may be dependent on the selected materials. For example, one SMP in a SMP TIM mixture may deform at a temperature of 10° C. after 30 minutes, therefore the curing may be done at a temperature lower than 10° C. or at a time less than 30 minutes. However, another SMP in another SMP TIM mixture may cure at 10° C. after one hour without any deformation or damage to the SMP. In some embodiments, the curing may be done at a controlled humidity. In some embodiments, the curing may be done at a controlled pressure.

In operation 410, the SMP TIM brick may be placed under a first load and prepared for slicing. The first load may compress the height of the SMP TIM pad before slicing. In various embodiments, the compression of the SMP TIM brick may match the compression of the SMP TIM pad during the assembly of the heat dissipating structure to the circuit board. For example, the SMP TIM brick may be compressed by 30 psi, before and during slicing, and the SMP TIM pad in the original state may be compressed to 30 psi when being assembled.

In various embodiments, during the compression, the SMP TIM brick may also be heated to a reformation condition change temperature. The reformation condition change temperature may define a first state (e.g., original state, or compressed state) of the SMP TIM pad after slicing. The original state of the SMP TIM pad may also be formed and reshaped from a second state (e.g., deformed state, or expanded state) after being exposed to the reformation condition change temperature.

In operation 412, the SMP TIM brick may be sliced. While under the first load, the SMP TIM brick may be sliced into one or more SMP TIM pads. The SMP TIM pads obtained from slicing may be prepared as original state SMP TIM pads (e.g., original state 210 FIG. 2). The SMP TIM pad may be sliced to a first width. For example, a SMP TIM brick may be 30 mm in width, 30 mm in length, and may be sliced to 1 mm in height. The original state SMP TIM pads may be used on the assembly (e.g., attachment) of a heat dissipating structure to a circuit board that is communicatively coupled to a computing chip (e.g., as shown in FIGS. 3A-D).

In some embodiments, the method 400 or any of the other methods disclosed in the disclosure may support the SMP TIM being generated in terms of the method 400 (e.g., the present disclosure includes a product generated by performing the steps of method 400). That is, the SMP TIM may be a product that derives its novel properties from the unique process described in the method 400 or from any combination of the other methods disclosed. For example, the SMP TIM may derive the unique property of increased thermal transfer by inclusion of operation 404 in which the carbon fibers are aligned. The above is not to be limiting or controlling, only an example of how the SMP TIM disclosed may be described in terms of the method used to generate the SMP TIM.

Figure 5:
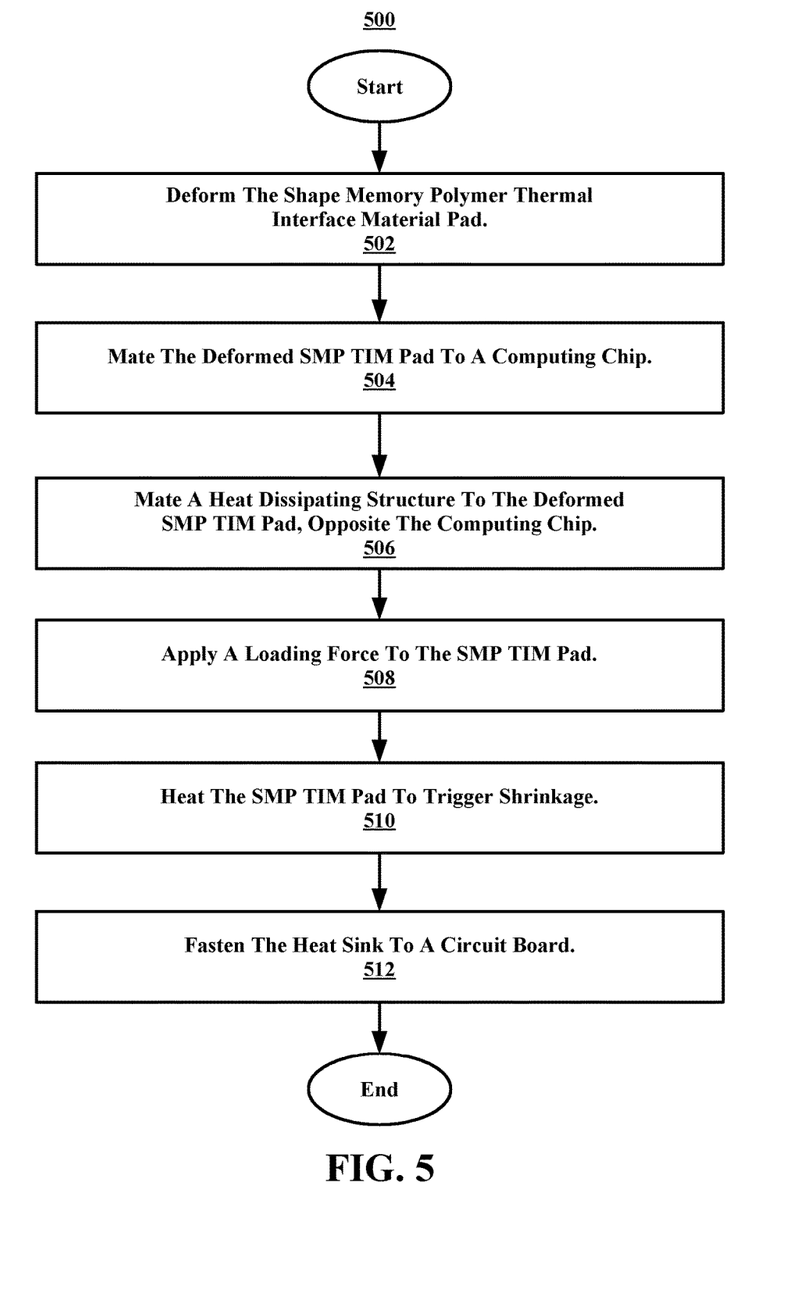
FIG. 5 depicts a flowchart of an example method for assembling a heat dissipating structure with a shape memory liquid crystal elastomer thermal interface material pad, according to various embodiments of the disclosure.

FIG. 5 depicts a flowchart of a method 500 for assembling a heat dissipating structure using a shape memory polymer thermal interface material pad, according to embodiments. The assembly of the heat dissipating structure may include a computing chip (e.g., computing chip 340, FIG. 3A), an SMP TIM pad (e.g., deformed SMP TIM pad 312, FIG. 3A), a heat dissipating structure (e.g., heat dissipating structure 350, FIG. 3B), a circuit board (e.g., circuit board 300, FIG. 3A), and one or more fasteners (e.g., fasteners 360, FIG. 3D). The heat dissipating structure may be attached to the circuit board to dissipate heat generated from a computing chip. The computing chip may be communicatively coupled to the circuit board, and thermally coupled with the heat dissipating structure with a SMP TIM pad positioned between the computing chip and the heat dissipating structure.

The method 500 may begin at operation 502 where a shape memory polymer thermal interface material pad, for example an LCE TIM pad, may be deformed to a second state (from a resting/first/original state). For example, the SMP TIM pad may be heated to a second temperature (e.g., an expansion temperature that is above the resting/room temperature of the SMP TIM pad) of 125° C. to change the SMP TIM pad from a first state (e.g., original state 210, FIG. 2) of 1 mm thickness to the deformed state (e.g., second state) of 1.5 mm thickness. The deformed state SMP TIM pad may then be positioned on a first (e.g., upper) face of the computing chip.

In operation 504, the deformed SMP TIM pad may be mated on the first face of a computing chip. After deformation, the SMP TIM pad may be positioned on the computing chip, above the top surface of the computing chip. The deformed SMP TIM pad may provide a thermal conductivity "bridge" between the computing chip and the heat dissipating structure distributing heat generated from the computing chip to the heat dissipating structure. The SMP TIM pad may maintain the deformed state during operation 504.

In operation 506, a heat dissipating structure is mated to the SMP TIM pad that was previously mated to the computing chip. The heat dissipating structure may be positioned above the SMP TIM pad opposite of the computing chip mated to the SMP TIM pad. The heat dissipating structure may be placed opposite of the computing chip to dissipate the heat from the computing chip. The heat dissipating structure may not be pressed into the SMP TIM pad and may be readjusted until a loading force is applied.

In some embodiments, operations 504 and 506 may be performed in the alternative order, or simultaneously. For example, in some embodiments the SMP TIM pad may be mated to the heat dissipating structure. The heat dissipating structure may then be placed on the computing chip such that the SMP TIM pad is mated to a surface of the computing chip. As used herein, mating include attaching the SMP TIM pad to a surface (e.g., using an adhesive or other mechanical means), as well as simply placing the SMP TIM pad into contact with the surface. For example, as used herein, mating may include simply placing the SMP TIM pad on the die of a computing chip such that they physically touch.

In operation 508, a loading force is applied to the SMP TIM pad. The loading force (e.g., compressive pressure) may be applied through the heat dissipating structure to compress the SMP TIM pad into the heat dissipating structure and the computing chip. In various embodiments, the loading force may be applied to the SMP TIM pad or the computing chip. The loading force may cause the SMP TIM pad to deform and fill in any gaps, or voids, in the surface(s) of the computing chip and/or the heat dissipating structure, or to cover any abscesses or protrusions on the surface of the heat dissipating structure and/or the computing chip. During the application of the loading force, any fasteners may remain free and may not be attached to the circuit board. In various embodiments, the fasteners may be used to apply the loading force upon the SMP TIM pad. The loading force applied to the SMP TIM pad may also assist in the alteration of the SMP TIM pad from the deformed state to the original state in operation 508.

In operation 510, the SMP TIM pad may be heated to trigger shrinkage. During the application of the loading force, the SMP TIM pad may be heated to a first temperature (e.g., reformation temperature) to trigger a reformation condition change of the SMP TIM pad returning the SMP TIM pad to the original state (e.g., non-deformed state). In various embodiments, the heating may be applied after the loading force is applied and removed. Shrinking the SMP TIM pad may reduce the distance between the computing chip and heat dissipating structure, and may increase the thermal conductivity (e.g., may cause the thermally conductive filler to move closer together).

In some embodiments, the SMP TIM pad may be heated with a heating element, which may be configured to provide a uniform heat throughout the SMP TIM pad. For example, the SMP TIM pad in the deformed state may be positioned between a heat dissipating structure and computing chip. The deformed state SMP TIM pad may be heated using a heating element to the compression temperature of 100° C. to trigger a compression of the SMP TIM pad to the original state of 1 mm in height.

In operation 512, the heat dissipating structure may be fastened to the circuit board. After returning the SMP TIM pad to the original state, the heat dissipating structure may be fastened to the circuit board to maintain the position of the heat dissipating structure above the computing chip with the SMP TIM pad in between. The fastening of the heat dissipating structure may include one or more fasteners or a fastening device capable of maintaining a relatively consistent pressure on the heat dissipating structure to hold the heat dissipating structure in place.

In various embodiments, the compressive pressure may be exerted though the heat dissipating structure, into the SMP TIM pad, by using the fasteners of the heat dissipating structure. The compressive pressure from the fasteners may compress the SMP TIM pad in a similar manner when compared to a compressive pressure exerted by a compressive element (e.g., compressive element 320 shown in FIG. 3C). The SMP TIM pad may then be heated by the heating element to trigger a shrinkage of the SMP TIM pad to the original state. The fasteners may then be tightened to exert a second pressure on the SMP TIM pad though the heat dissipating structure, and the fasteners may also hold the heat dissipating structure in place above the computing chip.

Some embodiments of the present disclosure may include a method for using a TIM pad. A shape memory polymer (SMP) TIM pad may be deformed to a deformed SMP TIM pad. The deformed SMP TIM pad may be mated to a first surface of a computing chip. A heat dissipating structure may be mated to the deformed SMP TIM pad opposite of the first surface of the computing chip. A loading force may be applied to the SMP TIM pad. The deformed SMP TIM pad may be heated to a reformation temperature. The heat dissipating structure may be fastened to the computing chip using one or more fasteners.

Some embodiments of the present disclosure include a method for making a SMP TIM pad. A SMP matrix and a thermally conductive filler may be mixed to create a SMP mixture. The SMP mixture may be extruded through a die. The thermally conductive filler in the SMP mixture may be aligned in substantially the same direction. The SMP mixture may be cured at a first temperature. The SMP mixture may be sliced into one or more SMP TIM pads.

Some embodiments of the present disclosure include a SMP TIM. The SMP material may include a SMP matrix. The SMP matrix may include a liquid crystal elastomer. The SMP material may also include a thermally conductive filler embedded within the SMP matrix. The thermally conductive filler may include one or more substantially aligned subcomponents.

Figure 6:
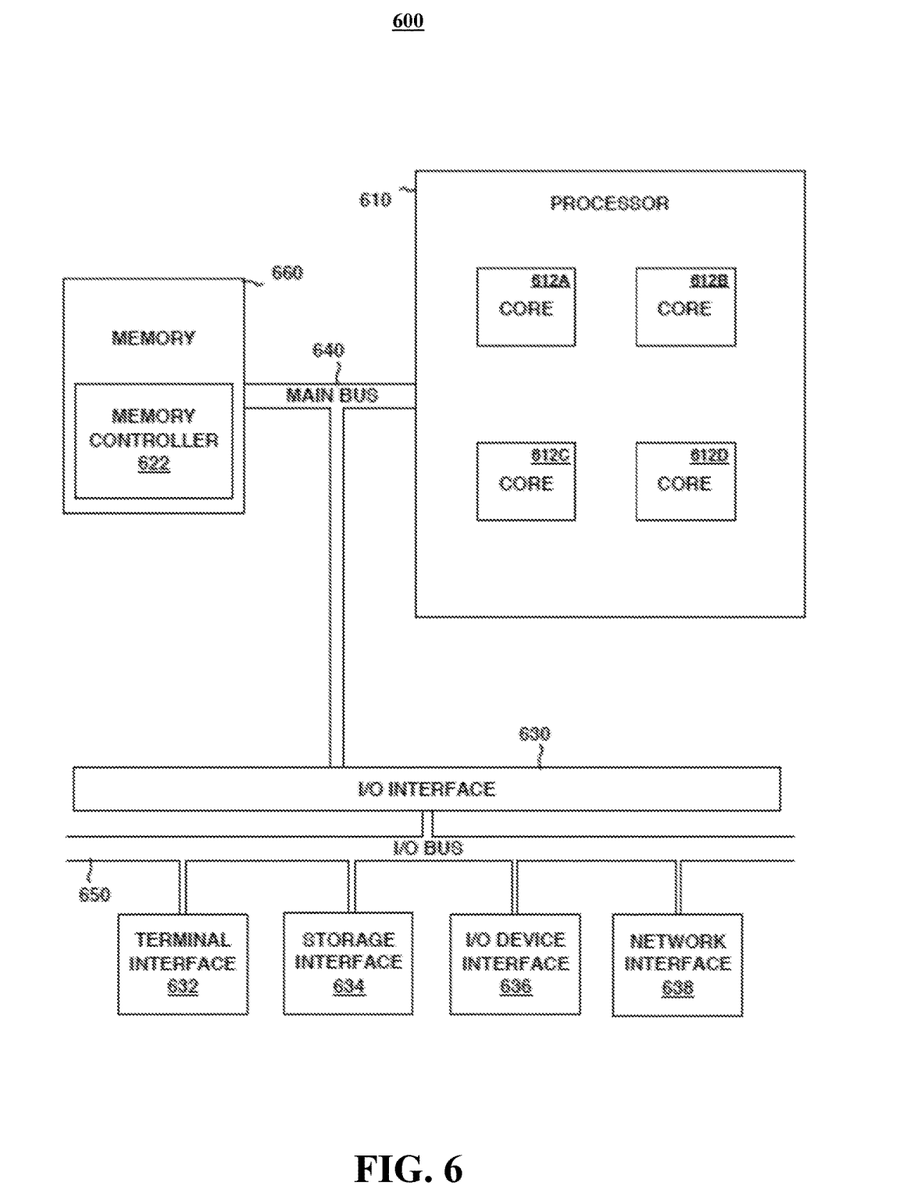
FIG. 6 depicts the representative major components of an example computer system, according to various embodiments of the disclosure.

FIG. 6 depicts the representative major components of an example computer system 601 that may be used, in accordance with embodiments of the present disclosure. It is appreciated that individual components may vary in complexity, number, type, and\or configuration. The particular examples disclosed are for example purposes only and are not necessarily the only such variations. The computer system 601 may comprise a processor 610, memory 620, an input/output interface (herein I/O or I/O interface) 630, and a main bus 640. The main bus 640 may provide communication pathways for the other components of the computer system 601. In some embodiments, the main bus 640 may connect to other components such as a specialized digital signal processor (not depicted).

The processor 610 of the computer system 601 may be comprised of one or more cores 612A, 612B, 612C, 612D (collectively 612). The processor 610 may additionally include one or more memory buffers or caches (not depicted) that provide temporary storage of instructions and data for the cores 612. The cores 612 may perform instructions on input provided from the caches or from the memory 620 and output the result to caches or the memory. The cores 612 may be comprised of one or more circuits configured to perform one or methods consistent with embodiments of the present disclosure. In some embodiments, the computer system 601 may contain multiple processors 610. In some embodiments, the computer system 601 may be a single processor 610 with a singular core 612.

The memory 620 of the computer system 601 may include a memory controller 622. In some embodiments, the memory 620 may comprise a random-access semiconductor memory, storage device, or storage medium (either volatile or non-volatile) for storing data and programs. In some embodiments, the memory may be in the form of modules (e.g., dual in-line memory modules). The memory controller 622 may communicate with the processor 610, facilitating storage and retrieval of information in the memory 620. The memory controller 622 may communicate with the I/O interface 630, facilitating storage and retrieval of input or output in the memory 620.

The I/O interface 630 may comprise an I/O bus 650, a terminal interface 652, a storage interface 654, an I/O device interface 656, and a network interface 658. The I/O interface 630 may connect the main bus 640 to the I/O bus 650. The I/O interface 630 may direct instructions and data from the processor 610 and memory 620 to the various interfaces of the I/O bus 650. The I/O interface 630 may also direct instructions and data from the various interfaces of the I/O bus 650 to the processor 610 and memory 620. The various interfaces may include the terminal interface 652, the storage interface 654, the I/O device interface 656, and the network interface 658. In some embodiments, the various interfaces may include a subset of the aforementioned interfaces (e.g., an embedded computer system in an industrial application may not include the terminal interface 652 and the storage interface 654).

Logic modules throughout the computer system 601—including but not limited to the memory 620, the processor 610, and the I/O interface 630—may communicate failures and changes to one or more components to a hypervisor or operating system (not depicted). The hypervisor or the operating system may allocate the various resources available in the computer system 601 and track the location of data in memory 620 and of processes assigned to various cores 612. In embodiments that combine or rearrange elements, aspects and capabilities of the logic modules may be combined or redistributed. These variations would be apparent to one skilled in the art.

The computer system 601 may be used to determine the shape memory polymer matrix (e.g., SMP matrix 102, FIG. 1) and a thermally conductive filler (e.g., thermally conductive filler 104, FIG. 1) for creating the SMP TIM pad (e.g., SMP TIM 100, FIG. 1) based on thermal requirements of a computing chip (e.g., computing chip 310, FIG. 3C) and a heat dissipating structure (e.g., heat dissipating structure 350 shown in FIG. 3B). If a thermal requirement of a computing chip requires a highly compressible TIM, then a first SMP matrix may be selected instead of a second SMP matrix, which may include a higher compressibility factor at lower pressures. For example, if a compressibility of 30 psi with a lower thermal dispersion requirement of a first chip is inputted into the computer system, the computer system may output a SMP and a thermally conductive filler to the user for creating the SMP TIM pad. The SMP may be a LCE as the SMP matrix and a thermally conductive filler of beryllium oxide. The output may then inform the user of any quantities required for both the SMP matrix and the thermally conductive filler. The computer system 601 may also determine a slicing height of the original state (e.g., non-deformed shape) of the SMP TIM pad based on the thermal requirements of the computing chip.

The memory 660 may include a memory controller 622 configured to distribute thermal properties of combinations of SMP matrices and thermally conductive fillers. At least one of the cores of the processor (e.g., the first core 612A) may calculate based on the users SMP TIM pad requirements a list of one or more SMP TIM pad combinations. The user may input the requirements of the thermal dissipation of the computing chip though the I/O interface 636, and receive the calculated one or more SMP TIM pad combinations through the terminal interface 632.

The present disclosure may be a system, a method, and/or a computer program product. The computer program product may include a computer readable storage medium (or media) having computer readable program instructions thereon for causing a processor to carry out aspects of the present disclosure. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A shape memory polymer thermal interface material including:
   a shape memory polymer matrix, the shape memory polymer matrix including a liquid crystal elastomer; and
   a thermally conductive filler embedded within the shape memory polymer matrix, wherein the thermally conductive filler includes one or more substantially aligned subcomponents,
   wherein the substantially aligned subcomponents include electromagnetically responsive fibers combined with thermally conductive particles, and
   wherein the electromagnetically responsive fibers combined with the thermally conductive particles are substantially aligned in a first direction,
   wherein the thermally conductive particles are substantially aligned in the first direction when the thermally conductive particles are within thirty degrees from perpendicular to an XY-plane (first length as the X-axis, first width as the Y-axis).

2. The shape memory polymer thermal interface material of claim 1, wherein the substantially aligned subcomponents include electromagnetically responsive particles, and wherein the electromagnetically responsive particles are substantially aligned in the first direction.

3. The shape memory polymer thermal interface material of claim 1, wherein the substantially aligned subcomponents include electromagnetically responsive particles and the electromagnetically responsive fibers, and wherein the electromagnetically responsive particles and fibers are substantially aligned in the first direction.

4. The shape memory polymer thermal interface material of claim 3, wherein the electromagnetically responsive particles and fibers are configured to deform to a second direction.

5. The shape memory polymer thermal interface material of claim 1, wherein the shape memory polymer matrix is configured to expand anisotropically.

6. The shape memory polymer thermal interface material of claim 1, wherein the shape memory polymer matrix is configured to expand isotropically.

7. The shape memory polymer thermal interface material of claim 1, wherein shape memory polymer matrix includes one or more cross-linking polymer networks.

8. The shape memory polymer thermal interface material of claim 1, wherein the thermally conductive filler is selected from a group consisting of: carbon fibers, carbon nanotubes, silicon carbide, beryllium oxide, aluminum nitride, silver, boron nitride, zinc oxide, and aluminum oxide.

9. The shape memory polymer thermal interface material of claim 1, wherein the shape memory polymer matrix is selected from a group consisting of: polyurethane, polyethylene, polyethylene terephthalate, polyethylene glycol, and copolyester.

10. The shape memory polymer thermal interface material of claim 1, wherein the shape memory polymer matrix is a liquid crystal elastomer matrix, wherein the thermally conductive filler materials include carbon fibers and beryllium oxide, and wherein the carbon fibers are substantially aligned in the first direction.

\* \* \* \* \*